(12) United States Patent
Hirai et al.

(10) Patent No.: US 9,401,778 B2
(45) Date of Patent: Jul. 26, 2016

(54) TRANSMISSION DEVICE AND DISTORTION COMPENSATION METHOD

(71) Applicant: Panasonic Corporation, Osaka (JP)

(72) Inventors: Yoshito Hirai, Osaka (JP); Kouji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/534,921

(22) Filed: Nov. 6, 2014

(65) Prior Publication Data

US 2015/0180610 A1 Jun. 25, 2015

(30) Foreign Application Priority Data

Dec. 25, 2013 (JP) ................... 2013-267168

(51) Int. Cl.
| | |
|---|---|
| H04B 1/00 | (2006.01) |
| H04L 1/00 | (2006.01) |
| H03F 3/217 | (2006.01) |
| H03F 3/00 | (2006.01) |
| H04L 27/36 | (2006.01) |
| H03F 1/32 | (2006.01) |

(52) U.S. Cl.
CPC ............ *H04L 1/0042* (2013.01); *H03F 1/3247* (2013.01); *H03F 3/005* (2013.01); *H03F 3/217* (2013.01); *H04L 1/0043* (2013.01); *H04L 27/364* (2013.01)

(58) Field of Classification Search
CPC ............. H04B 1/04; H04B 1/00; H04L 27/00
See application file for complete search history.

(56) References Cited

U.S. PATENT DOCUMENTS

| | | | | | |
|---|---|---|---|---|---|
| 5,705,949 | A * | 1/1998 | Alelyunas | ............... | H03D 3/008 |
| | | | | | 329/304 |
| 6,940,930 | B2 * | 9/2005 | Brown | ................ | H04L 27/3863 |
| | | | | | 375/147 |
| 8,023,588 | B1 * | 9/2011 | Benson | ............. | H04L 25/03343 |
| | | | | | 330/147 |
| 8,340,225 | B2 * | 12/2012 | Khoshgard | ......... | H04L 27/3963 |
| | | | | | 375/296 |
| 9,088,471 | B1 * | 7/2015 | Kim | ...................... | H04L 27/362 |
| 2003/0035494 | A1 * | 2/2003 | Bauder | .................... | H04B 1/62 |
| | | | | | 375/296 |
| 2006/0111071 | A1 * | 5/2006 | Paulus | ..................... | H04B 1/30 |
| | | | | | 455/302 |
| 2008/0025381 | A1 * | 1/2008 | Lee | .......................... | H04B 1/30 |
| | | | | | 375/219 |
| 2009/0054016 | A1 * | 2/2009 | Waheed | ............... | H03F 1/3247 |
| | | | | | 455/114.3 |
| 2012/0269293 | A1 | 10/2012 | Peng et al. | | |
| 2014/0155006 | A1 * | 6/2014 | Matsuura | .............. | H04B 7/005 |
| | | | | | 455/114.3 |
| 2014/0241461 | A1 * | 8/2014 | Kim | ...................... | H04B 1/0475 |
| | | | | | 375/297 |
| 2015/0180610 | A1 * | 6/2015 | Hirai | ..................... | H04L 1/0042 |
| | | | | | 375/297 |

FOREIGN PATENT DOCUMENTS

JP 09-069733 3/1997

* cited by examiner

*Primary Examiner* — Jaison Joseph

(74) *Attorney, Agent, or Firm* — Seed IP Law Group PLLC

(57) ABSTRACT

A storage unit stores a first lookup table including a plurality of correction coefficients for I codes, and stores a second lookup table including a plurality of correction coefficients for Q codes. Each of the correction coefficients for I codes and each of the correction coefficients for Q codes are complex numbers. A distortion compensation unit compensates, with one of the plurality of correction coefficients for I codes, distortion of an I code of a transmission signal to generate a first input signal, outputs the first input signal to an SCPA for I codes. The distortion compensation unit compensates, with one of the plurality of correction coefficients for Q codes, distortion of a Q code of the transmission signal to generate a second input signal, and outputs the second input signal to an SCPA for Q codes.

13 Claims, 9 Drawing Sheets

TRANSMISSION DEVICE AND DISTORTION COMPENSATION METHOD

BACKGROUND

1. Technical Field

The present disclosure relates to a transmission device and a distortion compensation method that compensate signal distortion.

2. Description of the Related Art

A class-D amplifier, equivalently, has a configuration in which output is performed with a switch between a power supply and an output, and a switch between ground and the output being alternately turned on. In an ideal operating state, power efficiency is high because there is no unnecessary through-current flowing from the power supply to ground.

However, in an actual circuit, if the switches are turned on at the same time, through-current flows between the power supply and ground and power efficiency decreases due to signal dullness or switch timing deviation or the like. As a countermeasure for this through-current, there is a technique in which non-overlapping clocks are used. Non-overlapping clocks refer to, in the case where a switch between a power supply and an output, and a switch between ground and the output are to be alternately turned on, the provision of time domains (non-overlapping periods) in which both switches are intentionally turned off. This is a technique that prevents the generation of through-current which decreases power efficiency, is extremely effective for increasing the efficiency of a class-D amplifier, and is widely used.

In order to realize high efficiency with a power amplifier configured using a complementary metal-oxide semiconductor integrated circuit (CMOS IC), a switched-capacitor power amplifier (SCPA), which is a type of class-D amplifier, is used. An SCPA carries out amplitude modulation by changing the number of amplifiers that switch between a power supply voltage and ground.

AM-AM characteristics and AM-PM characteristics are used as indexes for evaluating the performance of a power amplifier. FIG. 1A depicts the AM-AM characteristics of a general power amplifier, and FIG. 1B depicts the AM-PM characteristics of a general power amplifier. In FIGS. 1A and 1B, the solid line represents the ideal characteristics, and the line connecting the points plotted using white squares represents the actual characteristics. From FIG. 1A and FIG. 1B, it is apparent that the way in which a signal distorts is different depending on the size of the input. Furthermore, the distortion characteristics themselves also change due to the individual variations of the power amplifiers, temperature fluctuations, and changes that occur with aging.

Adaptive digital predistortion (hereafter, referred to as "adaptive DPD") is known as a technique for compensating this distortion. In adaptive DPD, the inverse characteristics of the distortion of a power amplifier corresponding to the size of the input of transmission data are held in a lookup table (LUT) as correction coefficients. The LUT is appropriately updated with the output of the power amplifier serving as a feedback signal, and the correction coefficients of the updated LUT are used to perform distortion compensation. Thus, it is possible to also respond to changes in distortion characteristics caused by individual variations, temperature fluctuations, and changes that occur with aging.

A technique for carrying out distortion compensation in an IQ quadrature transmission device in which an SCPA is used is disclosed in the specification of US Unexamined Patent Application Publication No. 2012/0269293. The specification of US Unexamined Patent Application Publication No. 2012/0269293 discloses a method in which correction coefficients are obtained in accordance with the size of I components and Q components in a training mode, a two-dimensional matrix LUT is generated, and linear interpolation is performed from the correction coefficients of the generated LUT for distortion compensation to be carried out. The method is implemented in this manner because the way in which a signal distorts is different according to the size of the I component and the size of the Q component.

Furthermore, generally, in transmission devices, there is a high demand for operation at high efficiency in addition to the suppression of power leakage to adjacent channels. In response to this demand, operation at high efficiency is possible in an SCPA by switching non-overlapping (hereafter referred to as "NOL") adjustment values in accordance with code size. The NOL adjustment values correspond to duty cycles. FIG. 2A depicts AM-AM characteristics at various NOL adjustment values (NOL=0 to 7), and FIG. 2B depicts AM-PM characteristics at various NOL adjustment values (NOL=0 to 7). Note that NOL=0 to 7 represent different duty cycles.

The AM-AM characteristics and the AM-PM characteristics when the NOL adjustment value is switched in accordance with code size are depicted in FIG. 3A and FIG. 3B, respectively. Here, switching is performed such that NOL=7 in codes 0 to 31, NOL=3 in codes 32 to 39, NOL=2 in codes 40 to 47, NOL=1 in codes 48 to 55, and NOL=0 in codes 56 to 63. From FIG. 3A and FIG. 3B, it is apparent that although gain linearity is maintained, phase fluctuations occur.

SUMMARY

However, in the distortion compensation method disclosed in the aforementioned specification of US Unexamined Patent Application Publication No. 2012/0269293, it is not possible to respond to fluctuations in characteristics when the NOL adjustment value is switched in accordance with code size in order to increase SCPA efficiency. Digital predistortion is a technique in which the inverse characteristics of the distortion characteristics of an SCPA are multiplied by an IQ input signal in advance, and the distortion characteristics of the SCPA are linearized. In order for this method to be effective, it is necessary for the inverse distortion characteristics of the SCPA to be accurately expressed by correction coefficients to the greatest extent possible. FIG. 4 depicts an IQ input signal (I and Q are positive). The IQ output signal produced when NOL switching is not carried out on this IQ input signal is depicted in FIG. 5, and the IQ output signal produced when NOL switching is carried out on this IQ input signal is depicted in FIG. 6. As is apparent from FIG. 6, when NOL switching is carried out, large gaps (the regions enclosed by dashed lines in FIG. 6) appear within the IQ data due to fluctuations in characteristics. The IQ data of the empty regions is not able to serve as output values regardless of the type of input, meaning that an optimum solution for inverse characteristics does not exist. Therefore, IQ data near the gaps is used for the IQ data in the gaps, and there is a decline in distortion compensation precision.

Thus, a non-limiting exemplary embodiment of the present disclosure provides a transmission device and a distortion compensation method that avoid a decline in distortion compensation precision even when fluctuations in characteristics due to NOL switching have occurred.

In one general aspect, the techniques disclosed here feature a transmission device including: a storage unit that stores a first lookup table that includes a plurality of correction coefficients for I codes, and a second lookup table that includes a plurality of correction coefficients for Q codes, each of the plurality of correction coefficients for I codes and each of the plurality of correction coefficients for Q codes being complex numbers; a distortion compensation unit that compensates, with one of the plurality of correction coefficients for I codes, distortion of an I code of a transmission signal to generate a first input signal, and compensates, with one of the plurality of correction coefficients for Q codes, distortion of a Q code of the transmission signal to generate a second input signal; a first switched-capacitor power amplifier that amplifies the first input signal; and a second switched-capacitor power amplifier that amplifies the second input signal.

In another general aspect, the techniques disclosed here feature a distortion compensation method configured so as to include: updating a first lookup table that includes a plurality of correction coefficients for I codes, and a second lookup table that includes a plurality of correction coefficients for Q codes, each of the plurality of correction coefficients for I codes and each of the plurality of correction coefficients for Q codes being complex numbers; compensating, with one of the plurality of correction coefficients for I codes, distortion of an I code of a transmission signal to generate a first input signal, and inputting the first input signal into a first switched-capacitor power amplifier; and compensating, with one of the plurality of correction coefficients for Q codes, distortion of a Q code of the transmission signal to generate a second input signal, and inputting the second input signal into a second switched-capacitor power amplifier. These general and specific aspects may be implemented using a system, a method, and a computer program, and any combination of systems, methods, and computer programs.

According to the present disclosure, it is possible to avoid a decline in distortion compensation precision even when fluctuations in characteristics due to NOL switching occurred. Additional benefits and advantages of the disclosed embodiments will be apparent from the specification and Figures. The benefits and/or advantages may be individually provided by the various embodiments and features of the specification and Figures, and need not all be provided in order to obtain one or more of the same.

DETAILED DESCRIPTION

Hereafter, embodiments of the present disclosure are described in detail with reference to the drawings. However, in the embodiments, the same reference numbers have been appended to configurations having the same function, and redundant descriptions have been omitted.

Embodiment 1

Figure 1A:
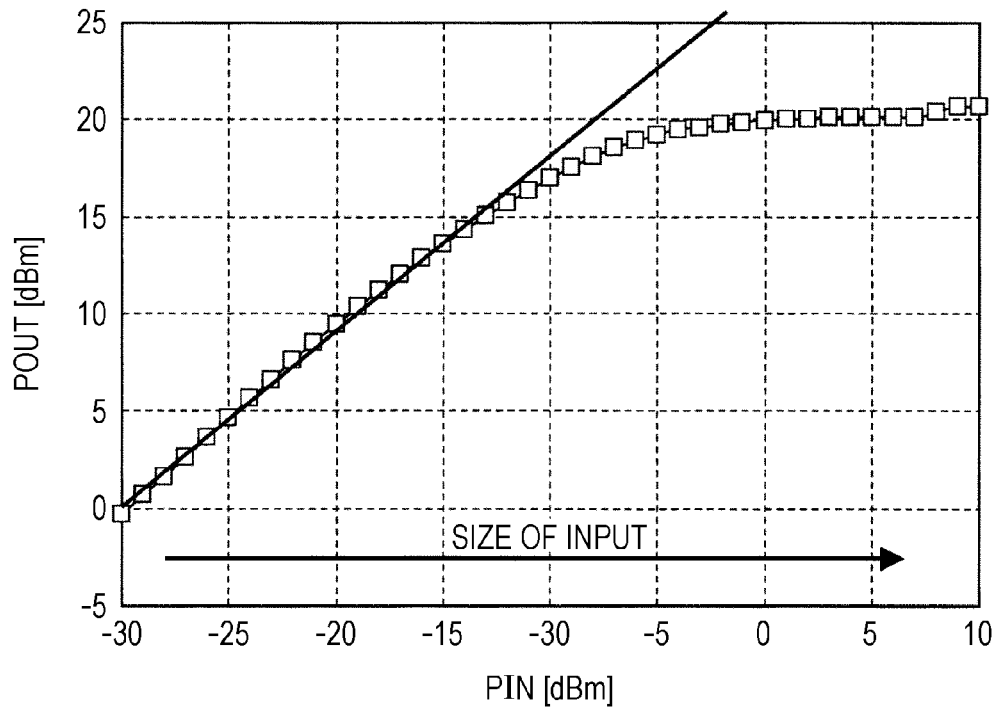
FIG. 1A is a drawing depicting the AM-AM characteristics of a general power amplifier.
Figure 1B:
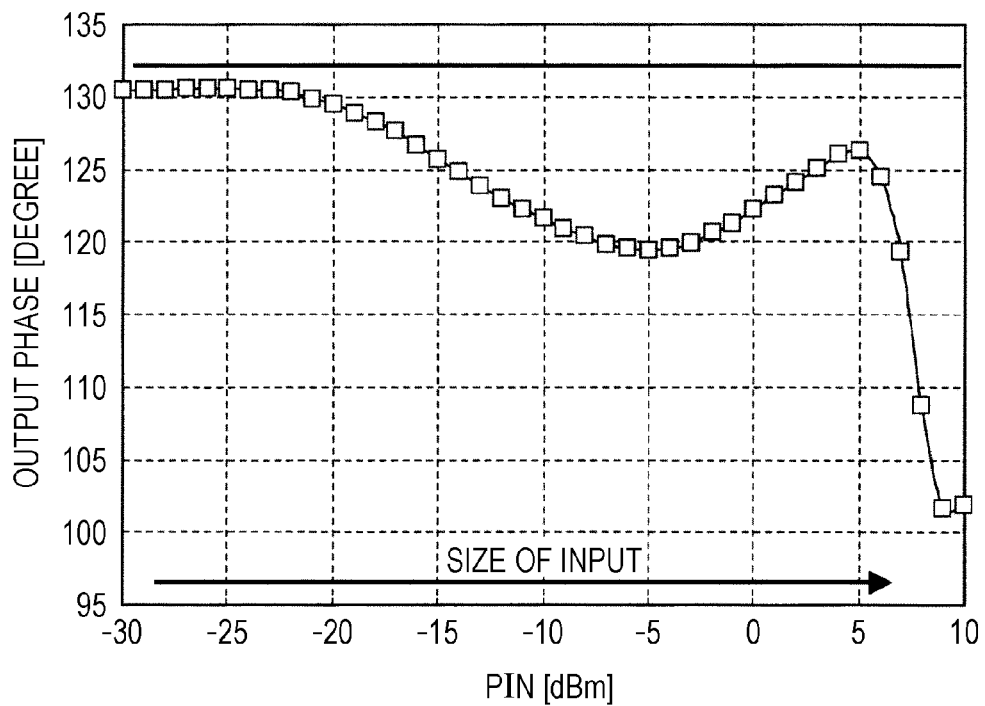
FIG. 1B is a drawing depicting the AM-PM characteristics of a general power amplifier.
Figure 2A:
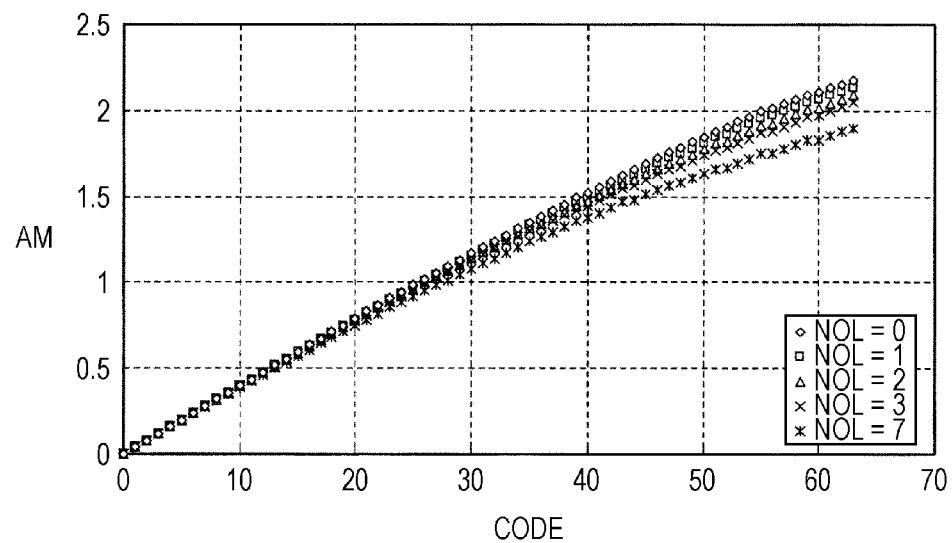
FIG. 2A is a drawing depicting AM-AM characteristics at various NOL adjustment values (NOL=0 to 7)
Figure 2B:
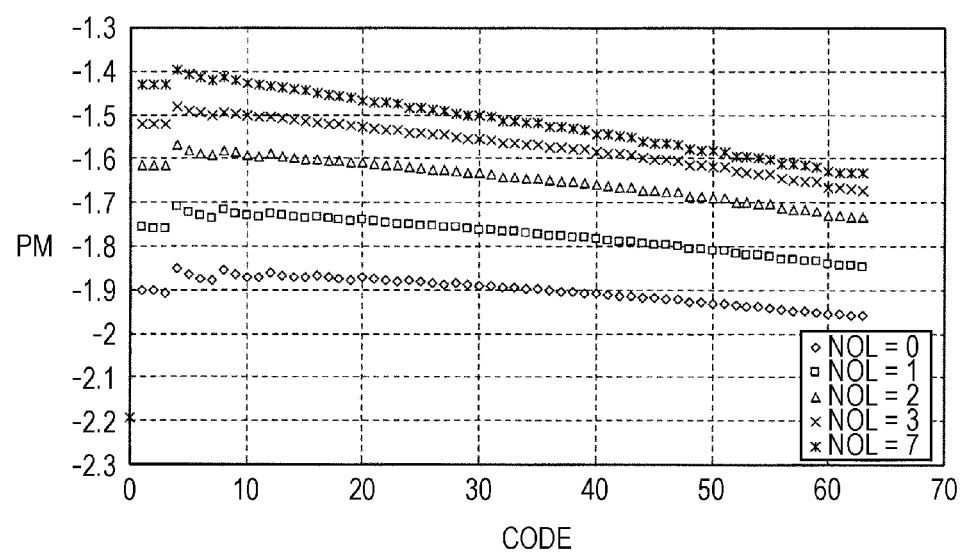
FIG. 2B is a drawing depicting AM-PM characteristics at various NOL adjustment values (NOL=0 to 7).
Figure 3A:
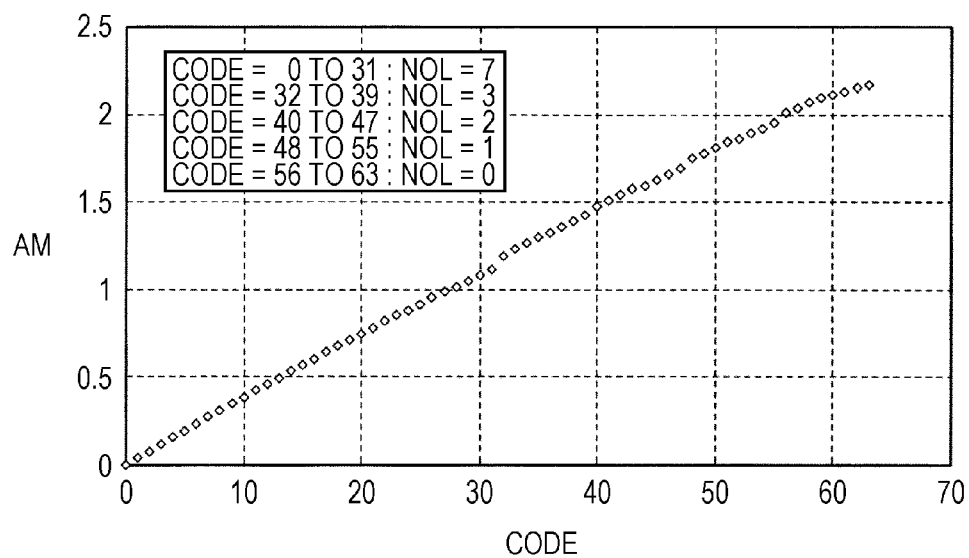
FIG. 3A is a drawing depicting AM-AM characteristics when the NOL adjustment value is switched in accordance with code size.
Figure 3B:
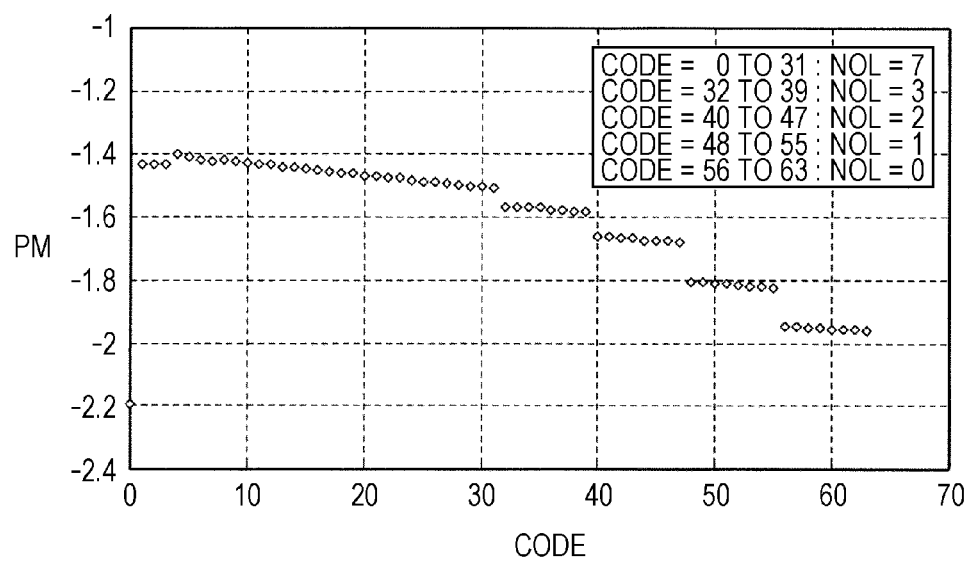
FIG. 3B is a drawing depicting AM-PM characteristics when the NOL adjustment value is switched in accordance with code size.
Figure 4:
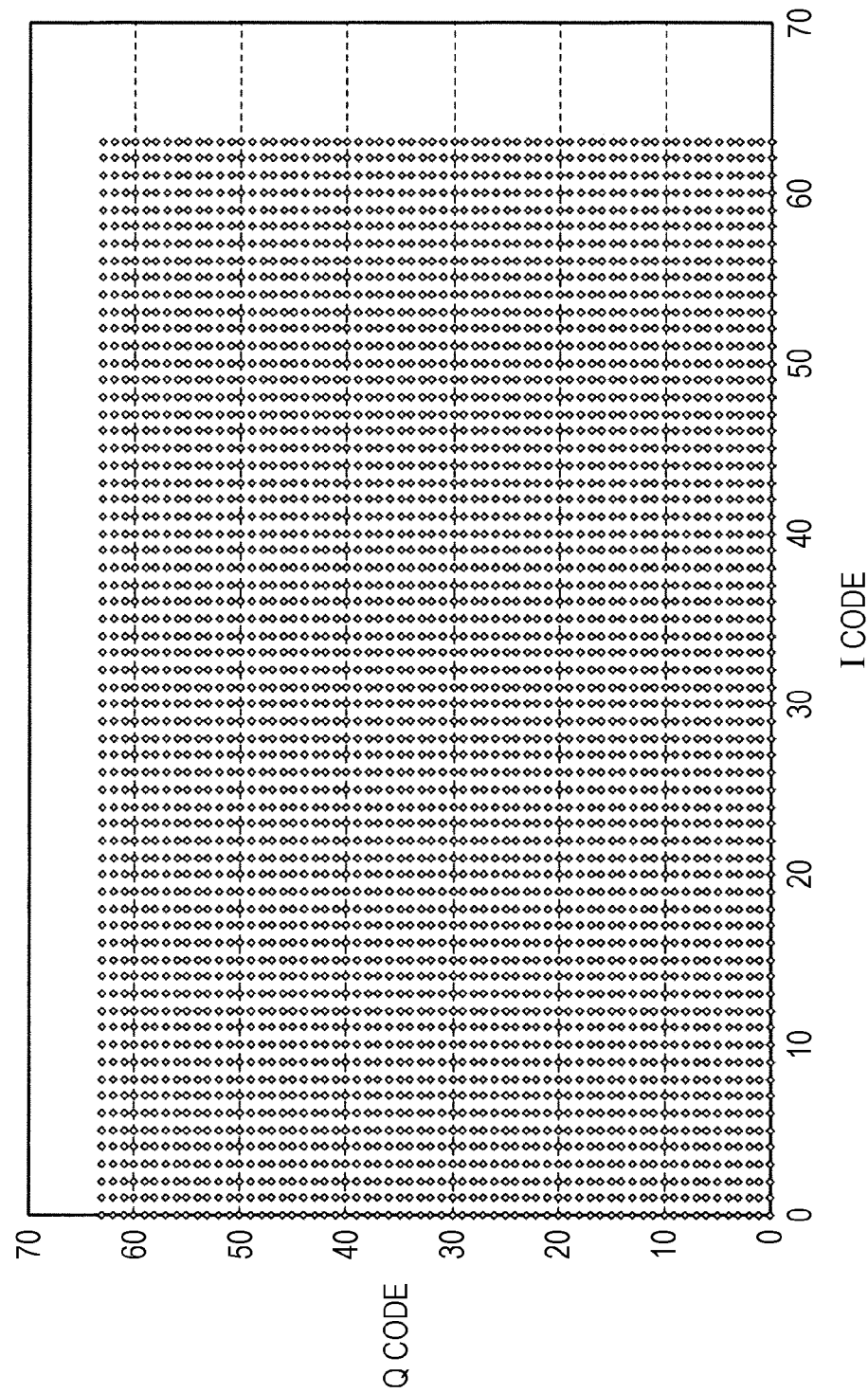
FIG. 4 is a drawing depicting an IQ input signal.
Figure 5:
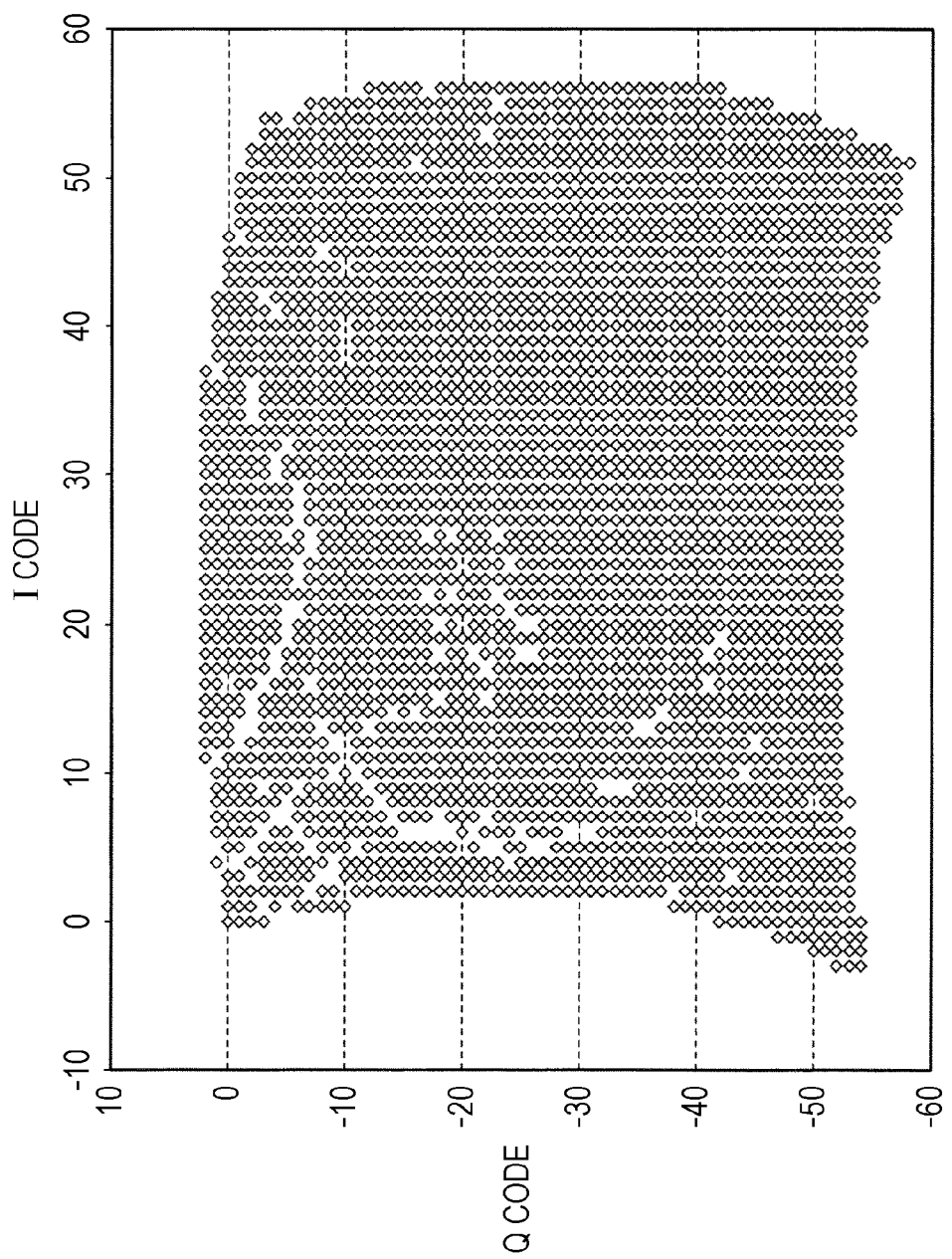
FIG. 5 is a drawing depicting an IQ output signal when NOL switching is not carried out.
Figure 6:
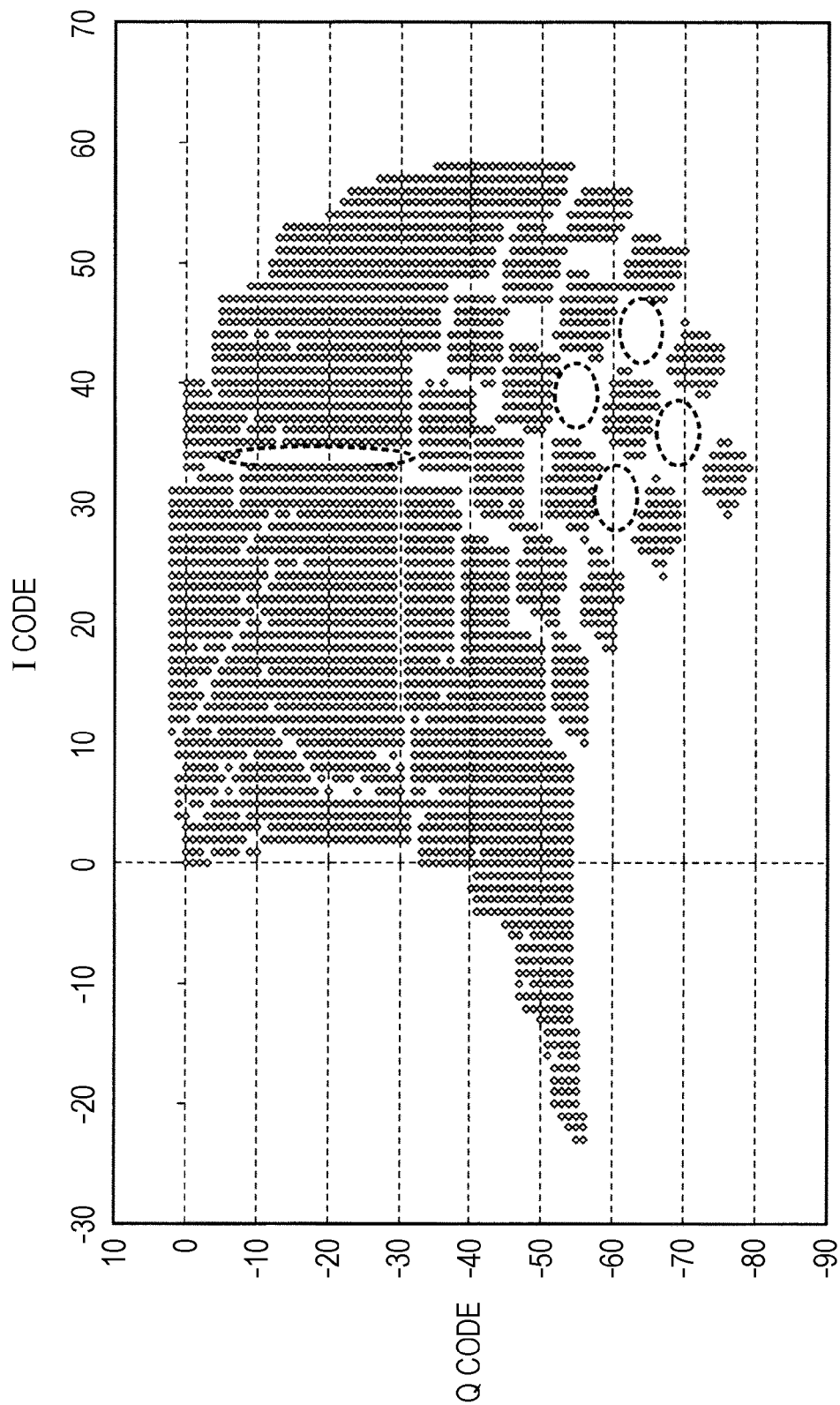
FIG. 6 is a drawing depicting an IQ output signal when NOL switching is carried out.
Figure 7:
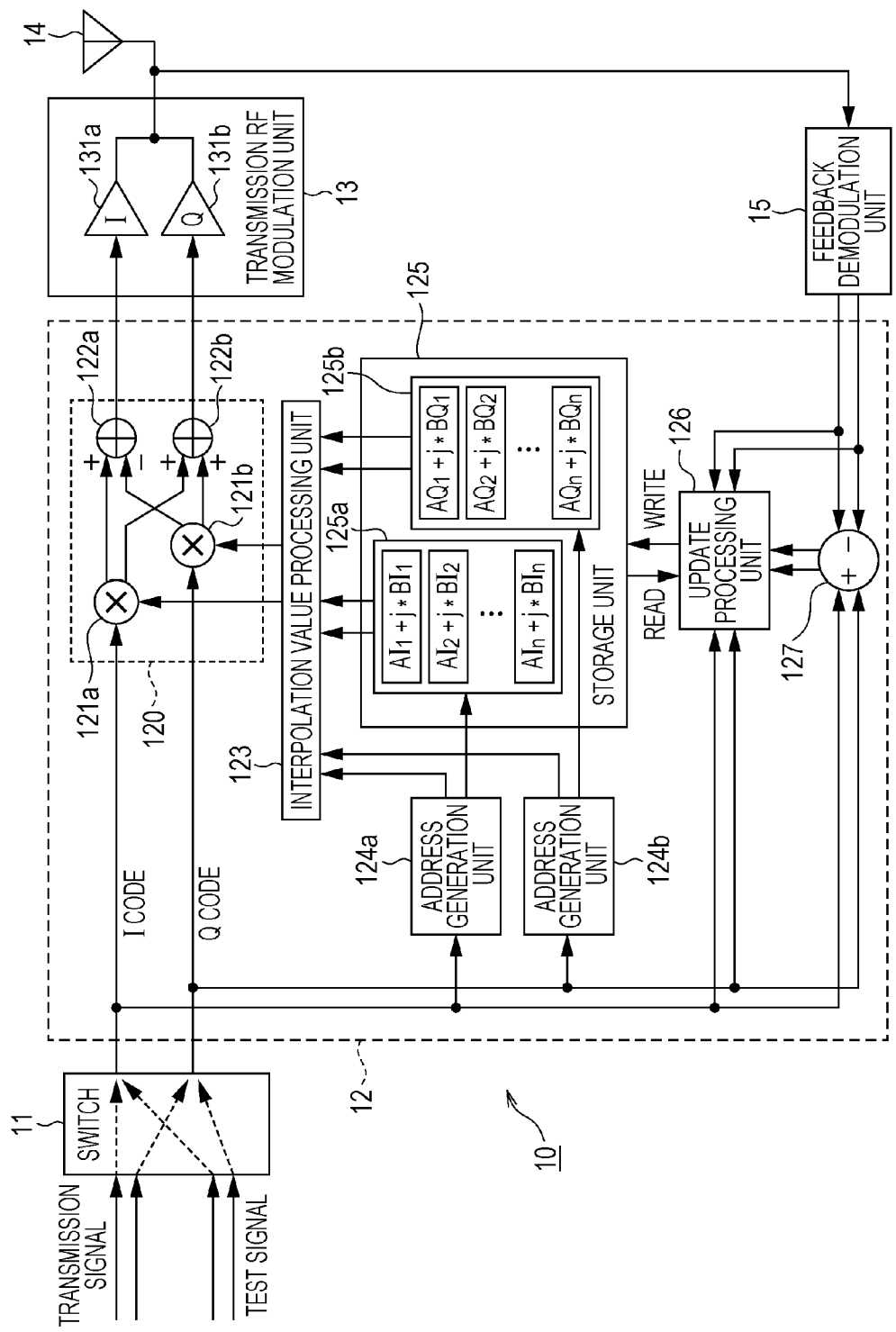
FIG. 7 is a block diagram depicting the configuration of part of a transmission device according to embodiment 1 of the present disclosure.

FIG. 7 is a block diagram depicting the configuration of part of a transmission device 10 according to embodiment 1 of the present disclosure. Hereafter, the configuration of the transmission device 10 is described using FIG. 7. The transmission device 10 is provided with a switch 11, a digital predistortion unit 12, a transmission RF modulation unit 13, an antenna 14, and a feedback demodulation unit 15.

The switch 11 has a transmission signal or a test signal input thereto, and divides these into and outputs I codes and Q codes. The switch 11 outputs the I codes to a multiplier 121$a$ in a distortion compensation unit 120, an address generation unit 124$a$, an update processing unit 126, and an error calculation unit 127. The switch 11 outputs the Q codes to a multiplier 121$b$ in the distortion compensation unit 120, an address generation unit 124$b$, the update processing unit 126, and the error calculation unit 127.

The address generation unit 124$a$ specifies a group that corresponds to the size of an I code output from the switch 11, one group being associated with each NOL adjustment value (for example, NOL=0 to 7) corresponding to the size of an I code, and generates an address that indicates the specified group and outputs the address to a storage unit 125$a$, or outputs the size of the I code to an interpolation value processing unit 123.

The address generation unit 124$b$ specifies a group that corresponds to the size of a Q code output from the switch 11, one group being associated with each NOL adjustment value (for example, NOL=0 to 7) corresponding to the size of a Q code, and generates an address that indicates the specified group and outputs the address to a storage unit 125$b$, or outputs the size of the Q code to the interpolation value processing unit 123.

The error calculation unit 127 calculates, as an error, the difference between the I codes and the Q codes output from the switch 11 and I codes and the Q codes output from the feedback demodulation unit 15 described hereafter, and outputs the calculated error to the update processing unit 126.

The update processing unit 126 uses the I codes and the Q codes output from the switch 11, the error output from the error calculation unit 127, and the I codes and the Q codes output from the feedback demodulation unit 15 described hereafter, to carry out update processing for the correction coefficients stored in the storage units 125$a$ and 125$b$.

The storage unit 125$a$ stores, in each address, a complex-number correction coefficient for an I code. The storage unit 125$a$ forms a lookup table (LUT) and outputs, to the interpolation value processing unit 123, a correction coefficient corresponding to the address output from the address generation unit 124$a$, and the correction coefficients for before and after the same NOL adjustment group. Furthermore, the storage unit 125$b$ stores, in each address, a complex-number correction coefficient for a Q code. The storage unit 125$b$ forms an LUT and outputs, to the interpolation value processing unit 123, a correction coefficient corresponding to the address output from the address generation unit 124b, and the correction coefficients for before and after the same NOL adjustment group. Here, when the resolution of an LUT is taken as N, in contrast to a two-dimensional matrix in which N×N correction coefficients are required, in the storage units 125a and 125b, 2×N correction coefficients are sufficient on the whole, and it is therefore possible to reduce the area of the LUT.

The interpolation value processing unit 123 uses the plurality of correction coefficients output from the storage unit 125 to carry out linear interpolation and obtain correction coefficients corresponding to the code sizes output from the address generation units 124a and 124b. The obtained correction coefficients (interpolation values) are then output to the multipliers 121a and 121b in the distortion compensation unit 120.

The distortion compensation unit 120 is provided with the multipliers 121a and 121b and adders 122a and 122b, carries out distortion compensation for the I codes and the Q codes output from the switch 11, and outputs to the transmission RF modulation unit 13.

The multiplier 121a multiplies a correction coefficient (I'+jQ') output from the interpolation value processing unit 123 by an I code (I) output from the switch 11. The real part (I×I') of the multiplication result (I×(I'+jQ')) is output to the adder 122a, and the imaginary part (I×Q') is output to the adder 122b. Furthermore, the multiplier 121b multiplies a correction coefficient (I"+jQ") output from the interpolation value processing unit 123 by a Q code (Q) output from the switch 11. The imaginary part (Q×Q") of the multiplication result (Q×(I"+jQ")) is output to the adder 122a, and the real part (Q×I") is output to the adder 122b.

The adder 122a adds the multiplication results output from the multipliers 121a and 121b, and outputs the adding result (I×I'−Q×Q") to an SCPA for I codes 131a of the transmission RF modulation unit 13. Furthermore, the adder 122b adds the multiplication results output from the multipliers 121a and 121b, and outputs the adding result (I×Q'+Q×I") to an SCPA for Q codes 131b of the transmission RF modulation unit 13.

The transmission RF modulation unit 13 is provided with the SCPA for I codes 131a and the SCPA for Q codes 131b. The SCPA for I codes 131a amplifies the adding result output from the adder 122a, and the SCPA for Q codes 131b amplifies the adding result output from the adder 122b. The transmission RF modulation unit 13 combines these amplified signals, and outputs them to the feedback demodulation unit 15 together with wirelessly transmitting them from the antenna 14.

The feedback demodulation unit 15 obtains I codes and Q codes by demodulating the signals output from the transmission RF modulation unit 13, and outputs these signals to the error calculation unit 127 and the update processing unit 126 as feedback signals.

Next, a procedure for calculating correction coefficients in a training mode is described. The transmission device 10 switches to the training mode, and a test signal is input to the switch 11. I codes of a random signal having any code size from the smallest to the largest are input as a test signal. However, the signal amplitude of the random signal may linearly increase, and may have a sawtooth waveform. Furthermore, the Q codes are fixed values such as 0.

The transmission device 10 stores correction coefficients obtained with this test signal in the storage unit 125a, and generates an LUT for I codes.

Next, Q codes of a random signal having any code size from the smallest to the largest are input as a test signal. However, the signal amplitude of the random signal may linearly increase, and may have a sawtooth waveform. Furthermore, the I codes are fixed values such as 0.

The transmission device 10 stores correction coefficients obtained with this test signal in the storage unit 125b, and generates an LUT for Q codes.

With the above procedure, it is possible for an LUT for I codes to be generated in the storage unit 125a, an LUT for Q codes to be generated in the storage unit 125b, and the correction coefficients of the generated LUTs to be used to carry out distortion compensation for a transmission signal.

In this way, according to embodiment 1, an LUT for I codes and an LUT for Q codes that manage correction coefficients made up of complex numbers are provided separately, and therefore a two-dimensional matrix LUT is no longer required, and it is possible to reduce the LUT area. Furthermore, accordingly, since it is possible to reduce the number of correction coefficients that are made to converge in the training mode, it is possible to reduce the time required for training. In addition, the signals input to the SCPA for I codes and the SCPA for Q codes are corrected individually, and the signals amplified in each SCPA are combined, and it is therefore possible to avoid a decline in distortion compensation precision even when fluctuations in characteristics due to NOL switching have occurred.

Note that in the present embodiment, the case where a storage unit is provided with an LUT for I codes and an LUT for Q codes has been described. However, as long as the SCPA for I codes and the SCPA for Q codes have the same configuration in a chip, it is possible to use a common LUT communized that operates as both of LUT for I codes and LUT of Q codes, since the performance will be the same despite there will be some relative variations.

Embodiment 2

Figure 8:
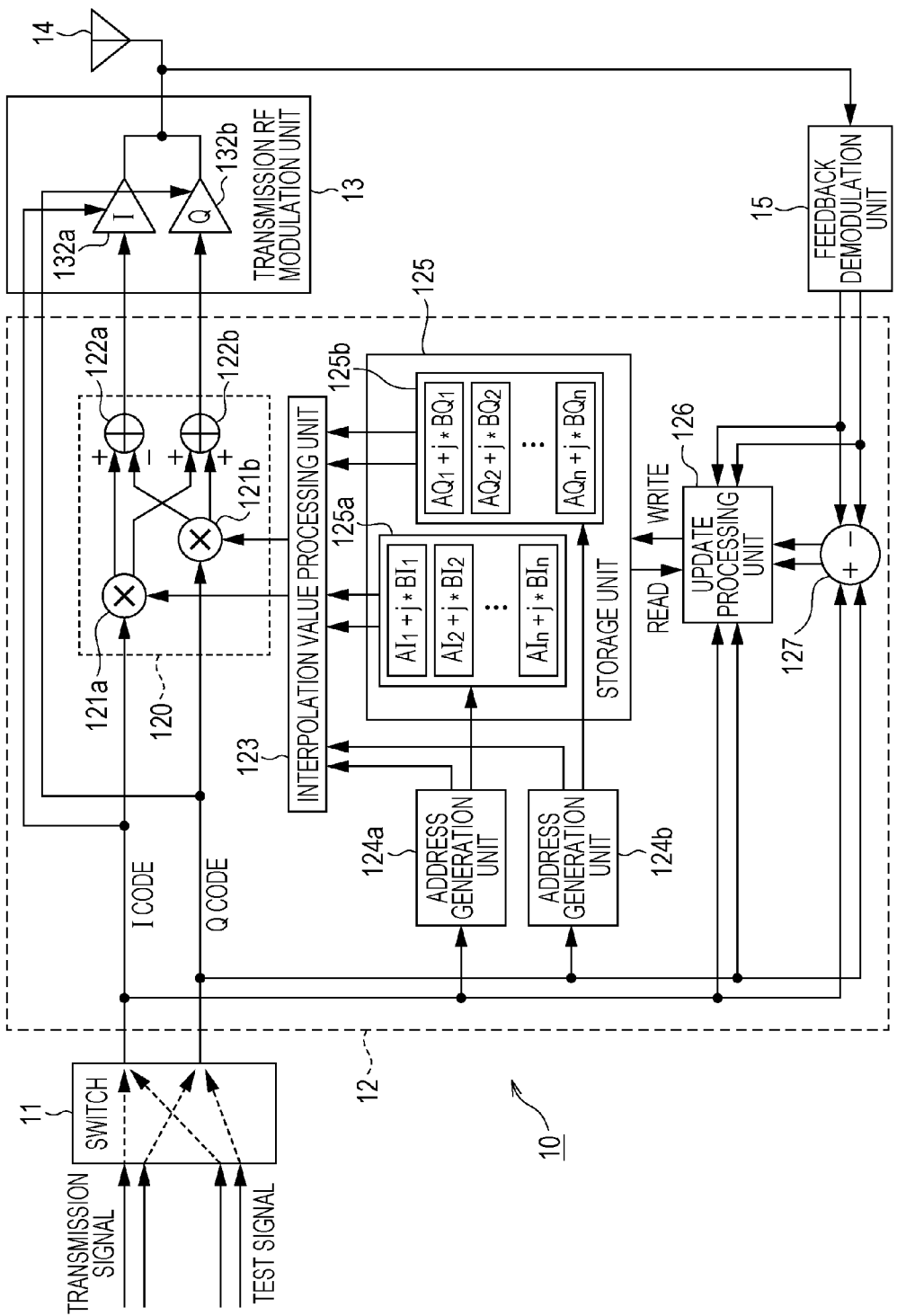
FIG. 8 is a block diagram depicting the configuration of part of a transmission device according to embodiment 2 of the present disclosure.

FIG. 8 is a block diagram depicting the configuration of part of a transmission device according to embodiment 2 of the present disclosure. The difference between FIG. 8 and FIG. 7 is that the SCPA for I codes 131a is changed to an SCPA for I codes 132a, and the SCPA for Q codes 131b is changed to an SCPA for Q codes 132b.

The SCPA for I codes 132a inputs a distortion-compensated I code (I code') output from the adder 122a, into an AM code, and uses a transmission-signal I code (I code) output from the switch 11, as a NOL switching signal. Furthermore, the SCPA for Q codes 132b inputs a distortion-compensated Q code (Q code') output from the adder 122b, into an AM code, and uses a transmission-signal Q code (Q code) output from the switch 11, as a NOL switching signal.

Thus, it is possible for the transmission signal prior to distortion compensation and the signal subsequent to distortion compensation to be synchronized, and therefore it is possible to amplify the signal subsequent to distortion compensation at an accurate NOL switching timing, and for distortion compensation precision to be improved.

In this way, according to embodiment 2, it is possible for the transmission signal prior to distortion compensation and the signal subsequent to distortion compensation to be synchronized by using the transmission signal prior to distortion compensation as a NOL switching signal. Therefore, it is possible to amplify the signal subsequent to distortion compensation at an accurate NOL switching timing, and for distortion compensation precision to be improved.

Embodiment 3

Figure 9:
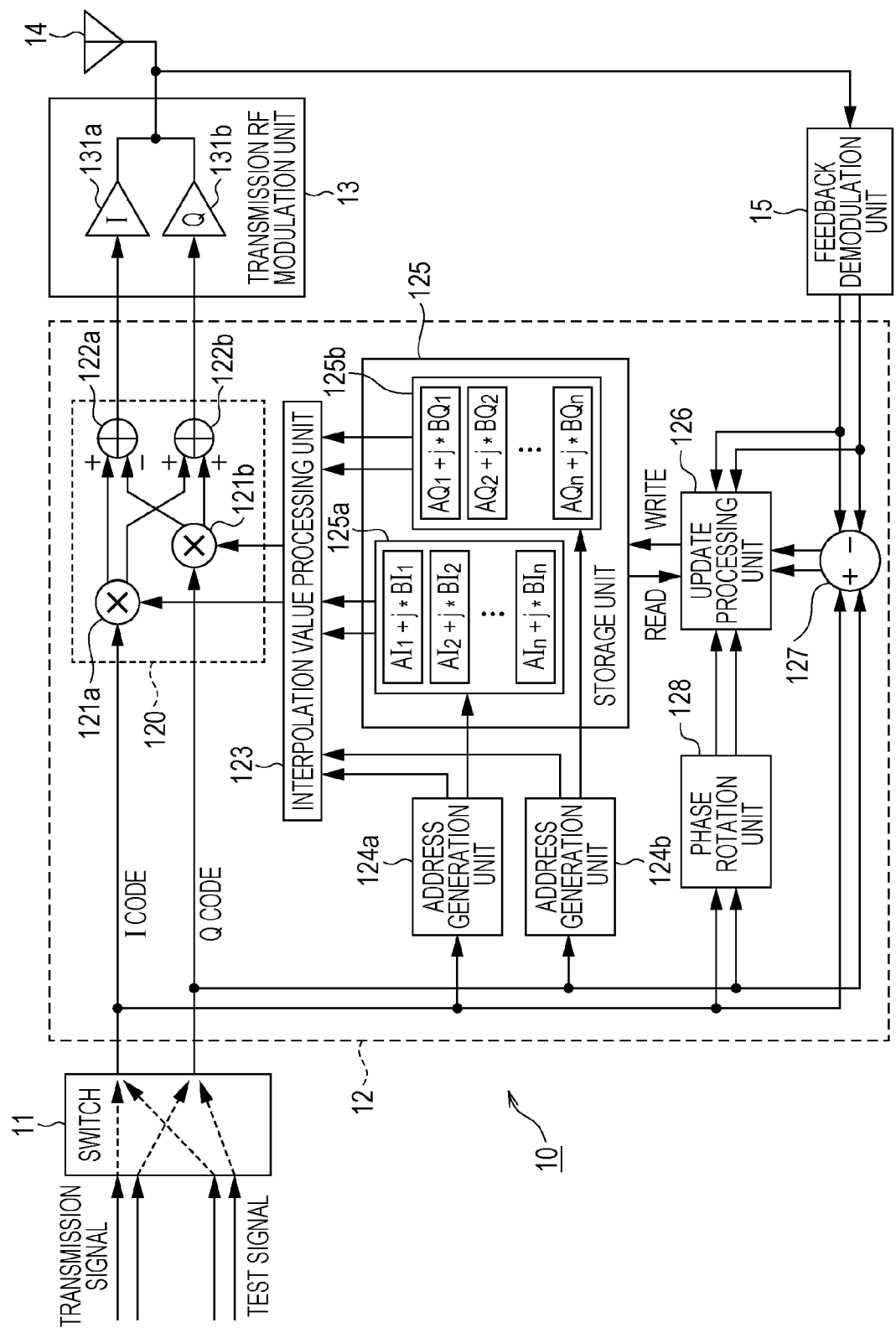
FIG. 9 is a block diagram depicting the configuration of part of a transmission device according to embodiment 3 of the present disclosure.

FIG. 9 is a block diagram depicting the configuration of part of a transmission device according to embodiment 3 of the present disclosure. The difference between FIG. 9 and FIG. 7 is that a phase rotation unit 128 is added.

The phase rotation unit 128 carries out phase rotation for the I codes and the Q codes output from the switch 11, and outputs to the update processing unit 126. Here, by bringing the amount of phase rotation in line with the amount of rotation actually implemented by the SCPAs to the greatest extent possible, it is possible for the inverse characteristics of the SCPAs for I codes and Q codes to be held separately in LUTs, and for distortion compensation precision to be improved. Note that in the SCPAs, the amount of phase rotation changes depending on the input code. Consequently, it is desirable for the amount of rotation implemented by the phase rotation unit 128 to be the value of the phase shift (PM) that corresponds to the AM code having the highest transmission frequency, in each of the transmission-signal I codes and Q codes.

Thus, correction coefficients converge at a value close to "1+0×j". Therefore, correction coefficients for I codes, that are stored at the storage unit 125a, become closer to individual distortion compensation by the SCPA for I codes 131a. And correction coefficients for Q codes, that are stored at the storage unit 125b, become closer to individual distortion compensation by the SCPA for Q codes 131b. In this way, it is possible for distortion compensation capability to be improved. Furthermore, by setting the initial values of the correction coefficients as "1+0×j", it is possible to shorten the convergence time for the correction coefficients.

In this way, according to embodiment 3, correction coefficients are obtained by carrying out phase rotation for a transmission signal with the phase shift that corresponds to the AM code having the highest transmission frequency serving as the amount of phase rotation. Thus, correction coefficients converge at a value close to "1+0×j". Therefore, correction coefficients for I codes, that are stored at the storage unit 125a, become closer to individual distortion compensation by the SCPA for I codes. And correction coefficients for Q codes, that are stored at the storage unit 125b, become closer to individual distortion compensation by the SCPA for Q codes. In this way, it is possible for distortion compensation capability to be improved. Furthermore, by setting the initial values of the correction coefficients as "1+0×j", it is possible to shorten the convergence time for the correction coefficients.

It is possible for the transmission device and the distortion compensation method according to the present disclosure to be applied in a wireless communication device or the like.

What is claimed is:

1. A transmission device comprising:
   a storage unit that independently stores a first lookup table that includes a plurality of correction coefficients for I codes, and a second lookup table that includes a plurality of correction coefficients for Q codes, each of the plurality of correction coefficients for I codes and each of the plurality of correction coefficients for Q codes being complex numbers;
   a distortion compensation unit that compensates, with one of the plurality of correction coefficients for I codes, distortion of an I code of a transmission signal to generate a first input signal, and compensates, with one of the plurality of correction coefficients for Q codes, distortion of a Q code of the transmission signal to generate a second input signal;
   a first switched-capacitor power amplifier that amplifies the first input signal; and
   a second switched-capacitor power amplifier that amplifies the second input signal,
   wherein the number of correction coefficients for I codes included in the first lookup table is a number of non-overlapping adjustment values for I codes, each of the non-overlapping adjustment values for I codes being a value for adjusting a non-overlapping period where both a first switch and a second switch included in the first switched-capacitor power amplifier are in an off-state, with the first switch located between a first power supply and a first output terminal of the first switched-capacitor power amplifier, and the second switch located between the first output terminal and a ground; and
   the number of correction coefficients for Q codes included in the second lookup table is a number of non-overlapping adjustment values for Q codes, each of the non-overlapping adjustment values for Q codes being a value for adjusting a non-overlapping period where both a third switch and a fourth switch included in the second switched-capacitor power amplifier are in an off-state, with the third switch located between a second power supply and a second output terminal of the second switched-capacitor power amplifier, and the fourth switch located between the second output terminal and the ground.

2. The transmission device according to claim 1 further comprising a switch that switches between input of the transmission signal and input of a test signal for training of correction coefficients, wherein
   the switch input the test signal to the distortion compensation unit,
   the distortion compensation unit uses the test signal to generate the correction coefficients for I codes and the correction coefficients for Q codes, and
   the storage unit stores the correction coefficients for I codes that are generated using the test signal in the lookup table for I codes and stores the correction coefficients for Q codes that are generated using the test signal in the lookup table for Q codes.

3. The transmission device according to claim 1, wherein the storage unit stores a common lookup table that operates as both of the first lookup table and the second lookup table.

4. The transmission device according to claim 1, wherein the distortion compensation unit comprises:
   a first multiplier that multiplies the I code of the transmission signal by one of the plurality of correction coefficients for I codes;
   a second multiplier that multiplies the Q code of the transmission signal by one of the plurality of correction coefficients for Q codes; and
   a first adder that adds a real part of a multiplication result of the first multiplier, and an imaginary part of a multiplication result by the second multiplier, to obtain the first input signal; and
   a second adder that adds an imaginary part of the multiplication result by the first multiplier, and a real part of the multiplication result by the second multiplier, to obtain the second input signal.

5. The transmission device according to claim 1,
   wherein the plurality of correction coefficients for I codes included in the first lookup table are associated with respective ones of a plurality of non-overlapping adjustment values, and
   the plurality of correction coefficients for Q codes included in the second lookup table are associated with respective ones of the plurality of non-overlapping adjustment values.

6. The transmission device according to claim 4, further comprising:
an interpolation value processing unit that performs linear interpolation of correction coefficients using the plurality of correction coefficients for I codes and the plurality of correction coefficients for Q codes to obtain an interpolation value.

7. The transmission device according to claim 1, wherein:
the first switched-capacitor power amplifier inputs the first input signal as an AM code, and uses the I code of the transmission signal as a non-overlapping switching signal, and
the second switched-capacitor power amplifier inputs the second input signal as an AM code, and uses the Q code of the transmission signal as a non-overlapping switching signal.

8. The transmission device according to claim 1, further comprising:
a phase rotation unit that rotates a phase of the I code and a phase of the Q code of the transmission signal; and
an update processing unit that uses the I code and the Q code whose phases are rotated, to update the plurality of correction coefficients for I codes and the plurality of correction coefficients for Q codes stored in the storage unit.

9. A distortion compensation method comprising:
updating a first lookup table that includes a plurality of correction coefficients for I codes, and a second lookup table that includes a plurality of correction coefficients for Q codes, each of the plurality of correction coefficients for I codes and each of the plurality of correction coefficients for Q codes being complex numbers, the first lookup table and the second lookup table being independently stored;
compensating, with one of the plurality of correction coefficients for I codes, distortion of an I code of a transmission signal to generate a first input signal, and inputting the first input signal into a first switched-capacitor power amplifier; and
compensating, with one of the plurality of correction coefficients for Q codes, distortion of a Q code of the transmission signal to generate a second input signal, and inputting the second input signal into a second switched-capacitor power amplifier,
wherein the number of correction coefficients for I codes included in the first lookup table is a number of non-overlapping adjustment values for I codes, each of the non-overlapping adjustment values for I codes being a value for adjusting a non-overlapping period where both a first switch and a second switch included in the first switched-capacitor power amplifier are in an off-state, with the first switch located between a first power supply and a first output terminal of the first switched-capacitor power amplifier, and the second switch located between the first output terminal and a ground; and
the number of correction coefficients for Q codes included in the second lookup table is a number of non-overlapping adjustment values for Q codes, each of the non-overlapping adjustment values for Q codes being a value for adjusting a non-overlapping period where both a third switch and a fourth switch included in the second switched-capacitor power amplifier are in an off-state, with the third switch located between a second power supply and a second output terminal of the second switched-capacitor power amplifier, and the fourth switch located between the second output terminal and the ground.

10. The transmission device according to claim 1, wherein the first lookup table includes a first vector of N number of correction coefficients for I codes and the second lookup table includes a second vector of N number of correction coefficients for Q codes, N being an integer larger than one and the first vector and second vector being independent of each other.

11. The transmission device according to claim 1, wherein:
when a non-overlapping adjustment value for I code is switched, a different correction coefficient for I codes is used, and
when a non-overlapping adjustment value for Q code is switched, a different correction coefficient for Q codes is used.

12. The distortion compensation method according to claim 9, wherein the first lookup table includes a first vector of N number of correction coefficients for I codes and the second lookup table includes a second vector of N number of correction coefficients for Q codes, N being an integer larger than one and the first vector and second vector being independent of each other.

13. The distortion compensation method according to claim 9, wherein:
when a non-overlapping adjustment value for I code is switched, a different correction coefficient for I codes is used, and
when a non-overlapping adjustment value for Q code is switched, a different correction coefficient for Q codes is used.

* * * * *